United States Patent [19]

Sanders et al.

[11] Patent Number: 4,578,663

[45] Date of Patent: Mar. 25, 1986

[54] MAGNETIC ASSEMBLY

[75] Inventors: Thomas C. Sanders, Palo Alto, Calif.; Wynne Calvert, Iowa City, Iowa

[73] Assignee: Lockheed Missiles & Space Company, Inc., Sunnyvale, Calif.

[21] Appl. No.: 676,503

[22] Filed: Nov. 29, 1984

[51] Int. Cl.$^4$ ............................................. H01F 7/02
[52] U.S. Cl. .................................... 335/306; 335/210; 335/302
[58] Field of Search ....................... 335/306, 304, 302; 315/5.35

[56] References Cited

FOREIGN PATENT DOCUMENTS 274681  9/1964  Netherlands ..................... 335/306

Primary Examiner—Harold Broome
Attorney, Agent, or Firm—John J. Morrissey

[57] ABSTRACT

A magnetic assembly comprising four magnets and four flux-carrying polepieces defines a working volume in which magnetic flux is distributed substantially uniformly over a major portion of the working volume. The magnetic assembly provides effective self-cancellation of stray magnetic field outside the working volume, and provides an optimized ratio of volume of magnetic flux to weight of magnetic material.

8 Claims, 19 Drawing Figures

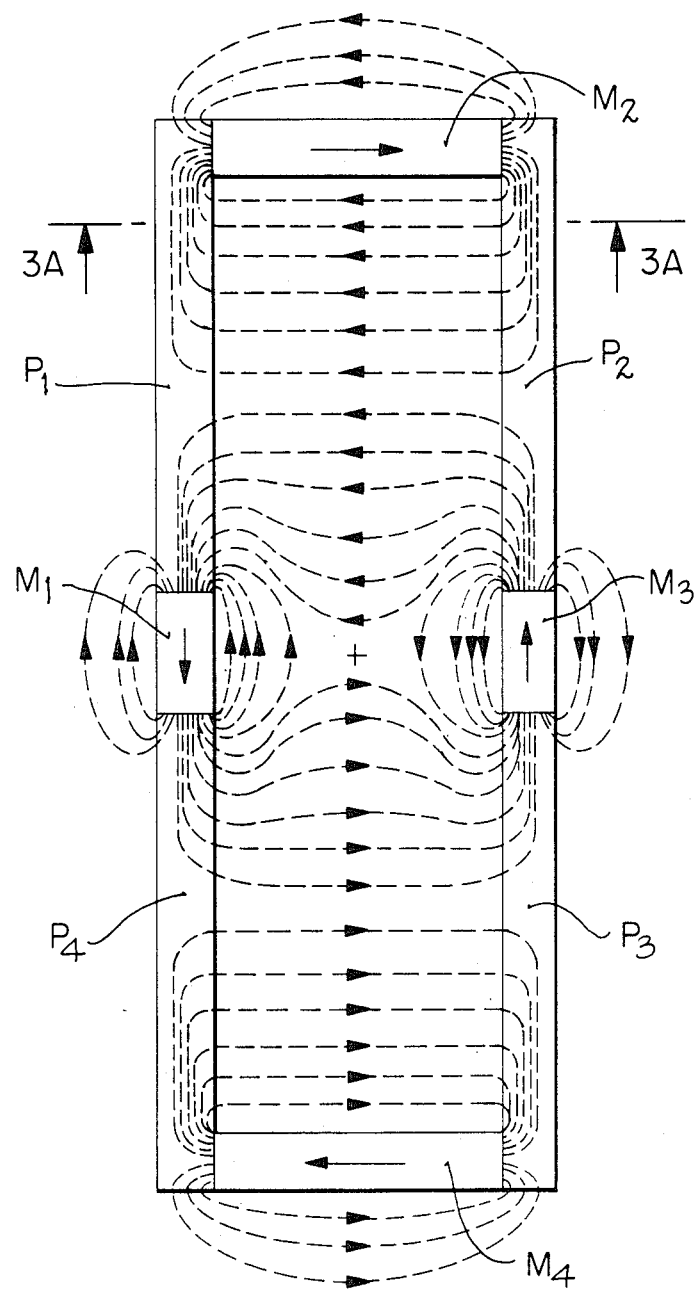
FIG_1

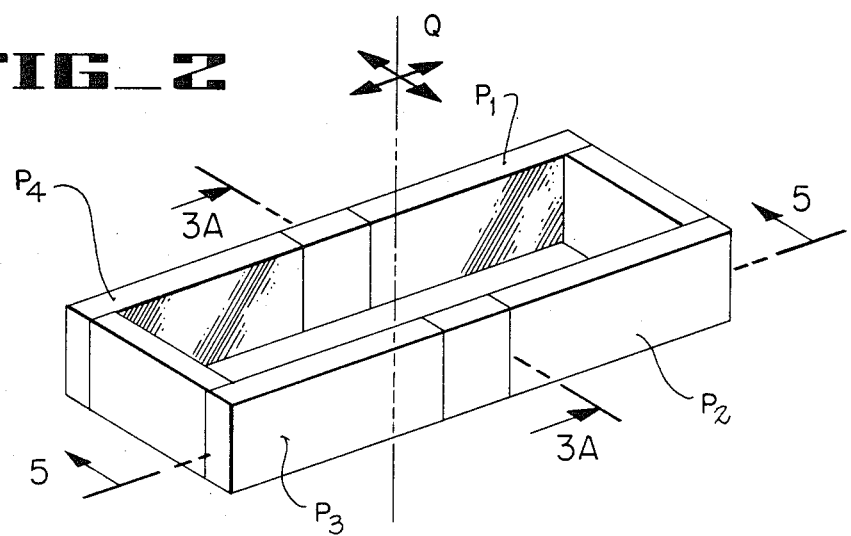
FIG_2
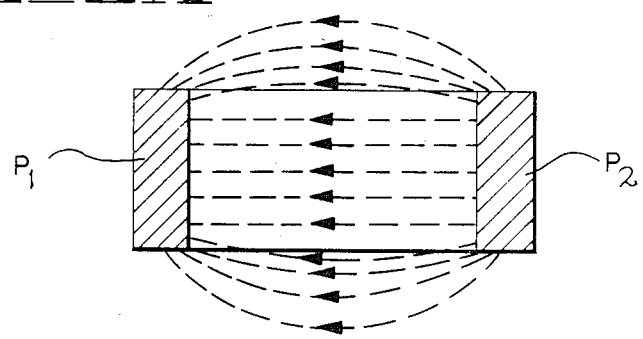
FIG_3A
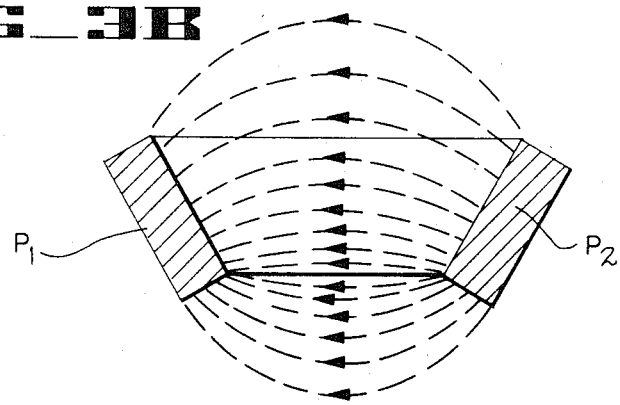
FIG_3B

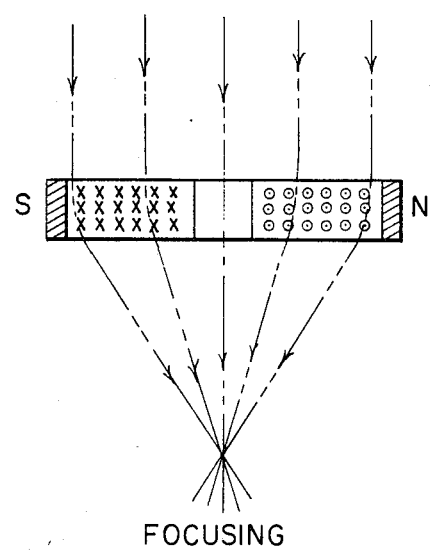
FIG_5
FOCUSING
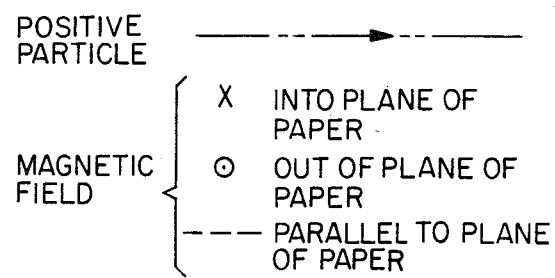
FIG_4
POSITIVE PARTICLE →
MAGNETIC FIELD:
- X  INTO PLANE OF PAPER
- ⊙  OUT OF PLANE OF PAPER
- — —  PARALLEL TO PLANE OF PAPER
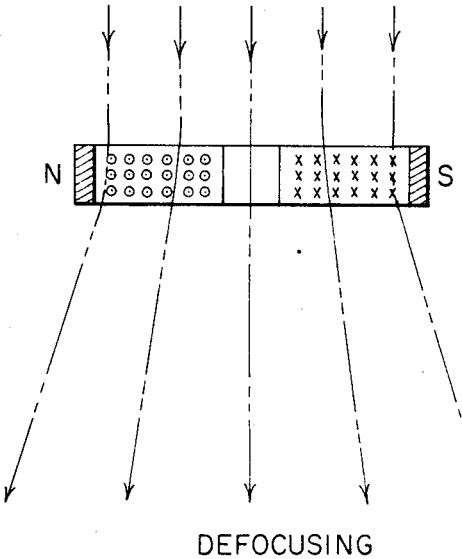
FIG_6
DEFOCUSING
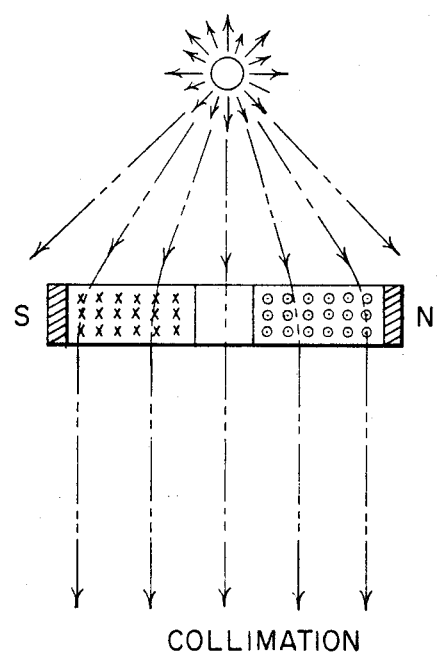
FIG_7
COLLIMATION
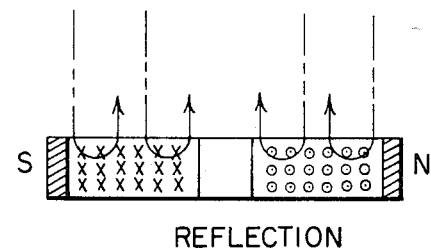
FIG_8
REFLECTION

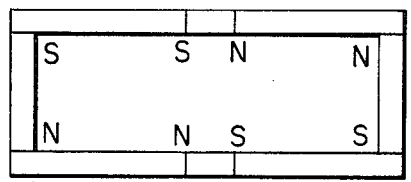
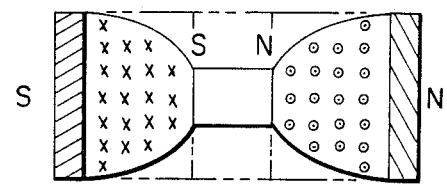
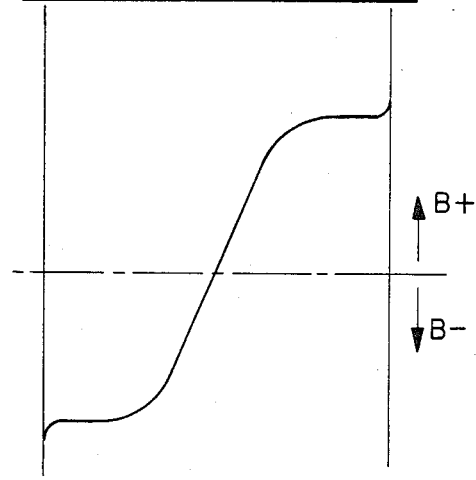
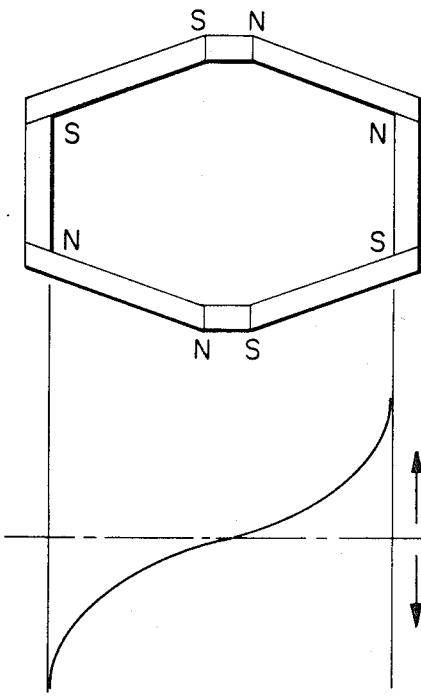
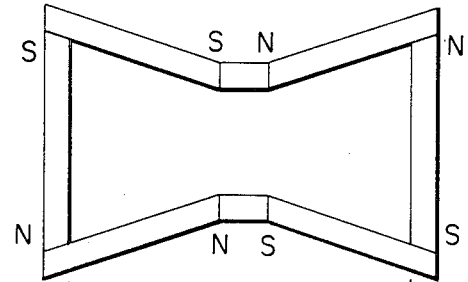
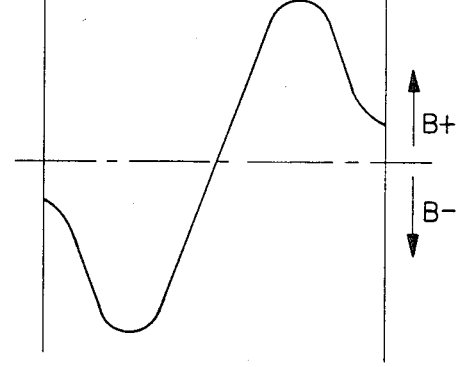

FIG_13
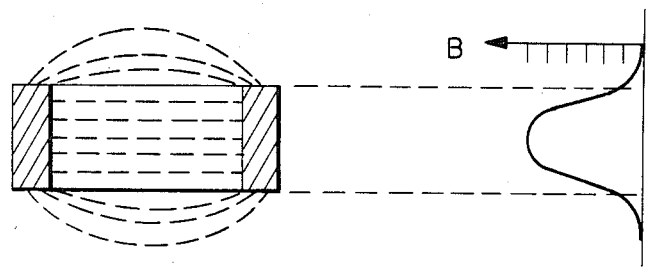
FIG_14
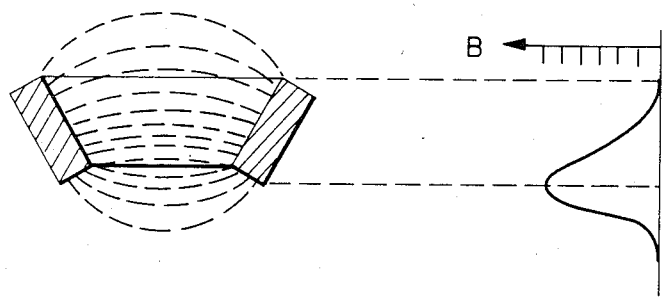
FIG_15
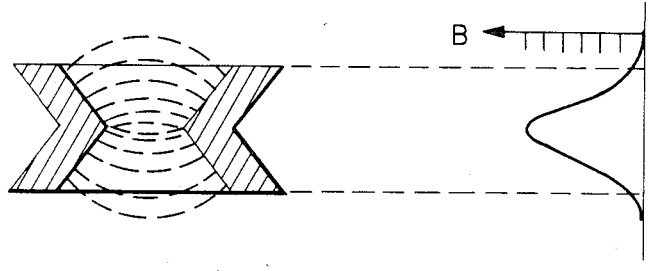
FIG_16
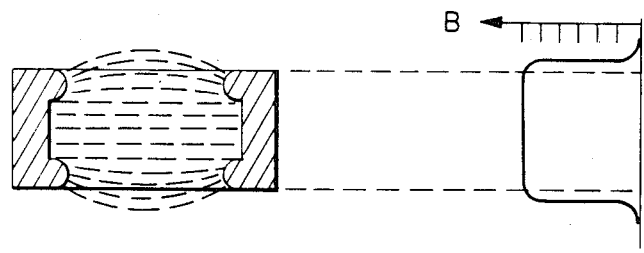

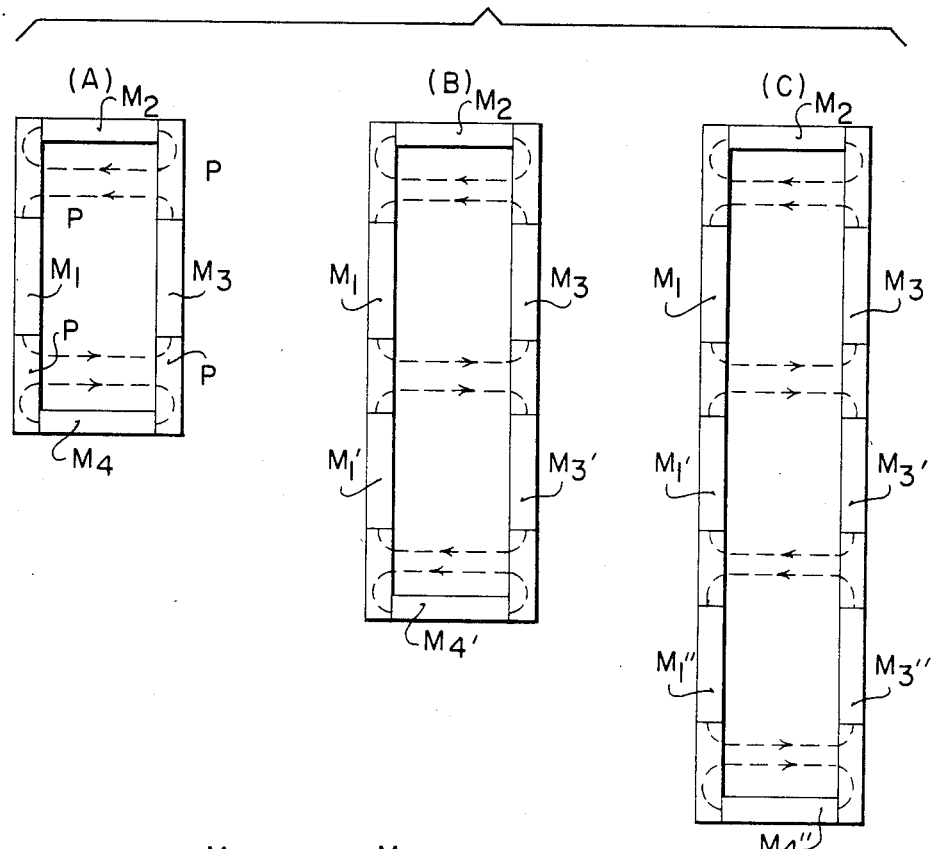
FIG_17
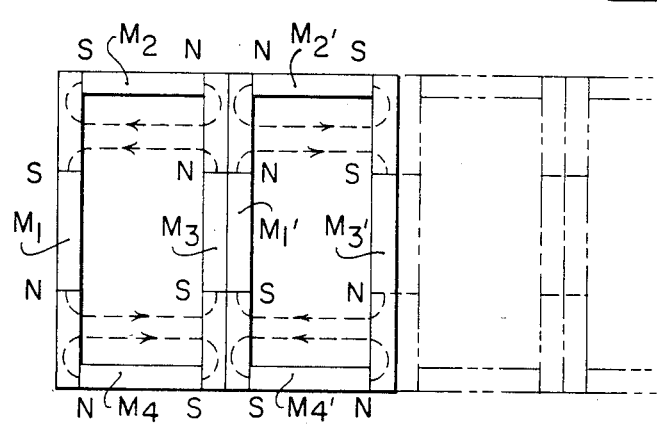
FIG_18

4,578,663

MAGNETIC ASSEMBLY

The Government has rights in this invention pursuant to Contract N00014-79-C-0824 awarded by the Department of the Navy.

TECHNICAL FIELD

This invention is concerned with producing specified magnetic fluxes in given volumes, particularly for the purpose of deflecting, reflecting, collimating or focussing electrically charged particles.

BACKGROUND ART

The production of a specified magnetic flux within a given working volume has conventionally required an assembly of magnets positioned so as to define the working volume, a ferromagnetic structure (called a yoke) of high magnetic permeability to provide a low-reluctance (i.e., low "magnetic resistance") path for the flux to and from the magnets, and poletips of low reluctance and high permeability to the distribute the flux over the working volume. Efficiency in the use of ferromagnetic materials from the standpoint of weight (and therefore cost) has conventionally required that the magnets be placed immediately adjacent the working volume, and that the poletips be used to transport the flux into the working volume. Generally, attempts in the prior art to decrease yoke weight have resulted in an increase in magnetic leakage flux (stray flux) due to loss of the yoke's shielding effect.

A dipole magnetic assembly designed for use as a focussing lens or collimator for kinescopes was described by K.K.N. Chang in "An Analytic Solution of a Magnetic Electron-Beam Bender", *RCA Review*, Vol. 42, pp. 111-117, (March 1981). Other applications of a commercial nature for dipole magnetic assemblies were described by K.K.N. Chang in "Collimated Electron Trajectory in a Nonuniform Transverse Magnetic Field", *RCA Review*, Vol. 40, pp. 390-396, (December 1979), and by D. Gabor in U.S. Pat. No. 2,872,607.

A dipole magnetic assembly (referred to as a "Watson magnet") for use in biasing computer bubble memories was described by D. S. Bartran and L. G. Chow in "An Analysis of Magnetic Fields Encountered Between Two Permeable Sheets", *IEEE Transactions on Magnetics*, Vol. MAG-10, No. 2, pp. 379-381, (June 1974).

SUMMARY OF THE INVENTION

It is an object of the present invention to provide a specified distribution of magnetic flux density within a working volume as defined by an assembly of magnets and polepieces, where the need for a ferromagnetic yoke is eliminated and where the magnetic flux leaking outside the working volume is effectively self-cancelling at a relatively short distance from the working volume.

A magnetic assembly according to the present invention comprises an assembly of magnets and polepieces whose dimensions and relative positions with respect to each other are tailored to produce a specified distribution of magnetic flux density within a specified working volume. The magnets and polepieces are positioned around the periphery of the working volume, so that the magnets are in series-opposed disposition with respect to each other and the polepieces are positioned so that each polepiece is located between two adjacent magnets to provide a flux path into the working volume from like poles of the adjacent magnets.

Depending upon the distribution of magnetic flux density specified for the particular application, an assembly of magnets and polepieces arranged according to the present invention could be used as a lens for deflecting, reflecting, collimating or focussing electrically charged particles passing through the working volume.

It is a feature of a magnetic assembly according to the present invention that a relatively large working volume of magnetic flux can be provided with effective self-cancellation of the stray magnetic field outside the working volume, and with an optimized ratio of volume of magnetic flux to weight of magnetic material for the assembly. The dimensions of the working volume of magnetic flux, and the distribution of the magnetic flux density within the working volume, can be selectively varied by changing the configurations and/or orientations of the polepieces.

A magnetic assembly comprising four magnets and four polepieces arranged according to the present invention can be considered as a basic unit, which can be combined with other such magnetic assemblies in end-to-end and/or side-by-side disposition to produce larger structures comprising two or more such basic units to fill an area of any desired size and configuration with discrete regions of uniform magnetic flux density without significant leakage of magnetic flux from any of the assemblies.

DESCRIPTION OF THE DRAWING

FIG. 1 is a plan view of a magnetic assembly comprising four magnets and four polepieces arranged in accordance with the present invention to provide a substantially uniform distribution of magnetic flux density within a working volume of generally rectangular cross-section.

FIG. 2 is a perspective view of the magnetic assembly of FIG. 1.

FIG. 3A is a cross-sectional view of the magnetic assembly of FIG. 1 as viewed along line 3A—3A of FIG. 2 indicating lines of magnetic flux between two parallel polepieces.

FIG. 3B is a cross-sectional view of an alternative embodiment of the present invention in which the two parallel polepieces shown in FIG. 3A are replaced by two polepieces that are inclined with respect to each other.

FIG. 4 illustrates graphical conventions used herein to represent a charged particle trajectory (viz., a double-dashed line with an arrow) and lines of magnetic flux (viz., an "x" to represent a magnetic flux line directed into the plane of the paper, a broken line with an arrow to represent a magnetic flux line lying in the plane of the paper, and a dot within a circle to represent a magnetic flux line directed out of the plane of the paper).

FIG. 5 is a cross-sectional view of the magnetic assembly of FIG. 1 as viewed along line 5—5 of FIG. 2 indicating that the magnets are oriented to define a magnetic flux distribution for causing a beam of positively charged particles passing through the working volume of magnetic flux to converge.

FIG. 6 is a cross-sectional view of an alternative embodiment of a magnetic assembly according to the present invention in which the magnets are oriented to define a magnetic flux distribution that causes a beam of positively charged particles passing through the working volume of magnetic flux to diverge.

FIG. 7 is a cross-sectional view of another alternative embodiment of a magnetic assembly according to the present invention in which the magnets are oriented to define a magnetic flux distribution that collimates positively charged particles which emanate from a point source and pass through the working volume of magnetic flux.

FIG. 8 is a cross-sectional view of the magnetic assembly of FIG. 1 in which the magnets are oriented as in FIG. 5, but in which the energies of the positively charged particles in the beam are so low relative to the magnetic flux density that the beam is reflected by the working volume of magnetic flux.

FIG. 9 is a cross-sectional view of an alternative embodiment of a magnetic assembly according to the present invention in which the arrangement of the magnets and polepieces provides a magnetic flux density distribution that approximates the "ideal focussing field".

FIG. 10 is another plan view of the magnetic assembly of FIG. 1 along with a graphical representation of the distribution of the magnetic flux density on a horizontal cross-section through the mid-plane of the working volume of magnetic flux.

FIG. 11 is a plan view of an alternative embodiment of the present invention in which parallel polepieces on opposite sides of the working volume as shown in FIG. 10 are replaced by polepieces that are bowed outwardly with respect to each other to provide a magnetic flux density distribution as indicated in the accompanying graphical representation.

FIG. 12 is a plan view of another alternative embodiment of the present invention in which parallel polepieces on opposite sides of the working volume as shown in FIG. 10 are replaced by polepieces that are bowed inwardly with respect to each other to provide a magnetic flux density distribution as indicated in the accompanying graphical representation.

FIG. 13 is cross-sectional view of the magnetic assembly of FIG. 1 as viewed along line 3A—3A of FIG. 2 along with a graphical representation of the magnetic flux density distribution in the working volume between two parallel polepieces on opposite sides of the working volume.

FIG. 14 is a cross-sectional view of an alternative embodiment of a magnetic assembly according to the present invention in which two polepieces on opposite sides of the working volume are inclined with respect to each other to provide a magnetic flux density distribution in which the peak flux density is shifted as indicated in the accompanying graphical representation.

FIG. 15 is a cross-sectional view of another alternative embodiment of a magnetic assembly according to the present invention in which two parallel polepieces on opposite sides of the working volume as shown in FIG. 13 are replaced by two polepieces of chevron-shaped transverse cross-sectional configuration to provide a magnetic flux density distribution in which the peak flux density is narrowed as indicated in the accompanying graphical representation.

FIG. 16 is a cross-sectional view of a further alternative embodiment of a magnetic assembly according to the present invention in which two parallel polepieces on opposite sides of the working volume as shown in FIG. 13 are replaced by two polepieces having inwardly protruding poletips along the edges on opposite sides of the working volume to provide a more uniform magnetic flux density distribution within the working volume as indicated in the accompanying graphical representation.

FIG. 17 illustrates plan views of combinations of magnetic assemblies according to the present invention arranged end-to-end in adjacent planar disposition with respect to each other.

FIG. 18 illustrates a plan view of combinations of magnetic assemblies according to the present invention arranged side-by-side in adjacent planar disposition with respect to each other.

Best Mode of Carrying Out the Invention

In a preferred embodiment of the invention as shown in FIG. 1, a magnetic assembly comprises four magnets $M_1$, $M_2$, $M_3$ and $M_4$ and four polepieces $P_1$, $P_2$, $P_3$ and $P_4$ arranged sequentially around the periphery of a rectangle so that the magnets are in series-opposed disposition with respect to each other, and so that a different polepiece is positioned between each pair of magnets, thereby defining a working volume of rectangular cross-section. The magnets $M_1$ and $M_3$, which are substantially equal to each other in length and have substantially identical magnetic properties, are positioned opposite each other at the middle of opposite longer-dimensioned sides bounding the rectangular working volume. The orientations of the north and south poles of the magnet $M_1$ are opposite to the orientations of the north and south poles of the magnet $M_3$. The magnets $M_2$ and $M_4$, which are substantially equal to each other in length and have substantially identical magnetic properties, are positioned opposite each other on the smaller-dimensioned sides bounding the rectangular working volume. The orientations of the north and south poles of the magnet $M_2$ are opposite to the orientations of the north and south poles of the magnet $M_4$.

The magnets $M_1$, $M_2$, $M_3$ and $M_4$ are illustrated in FIG. 1 as permanent magnets, but in principle could be either permanent magnets or electromagnets. The polepieces $P_1$, $P_2$, $P_3$ and $P_4$ are made of ferromagnetic material of high magnetic permeability, e.g., iron.

A line of magnetic flux is conventionally considered to run from a north magnetic pole N to a south magnetic pole S. With reference to FIG. 1, some of the lines of magnetic flux leaving the north pole of the magnet $M_1$ run directly to the south pole of the same magnet $M_1$. However, most of the lines of magnetic flux leaving the north pole of the magnet M are guided by the polepiece $P_4$ along the periphery of the working volume for a distance determined for each magnetic flux line by the permeance of the working volume separating the polepieces $P_4$ and $P_3$ and the magnetomotive force between them. The magnetic flux lines then enter into the working volume from the polepiece $P_4$ and pass across to the opposite polepiece $P_3$, which guides the magnetic flux lines to the south pole of the opposite magnet $M_3$.

In the same way, some of the lines of magnetic flux leaving the north pole of the magnet $M_3$ run directly to the south pole of the same magnet $M_3$. However, most of the lines of magnetic flux leaving the north pole of the magnet $M_3$ are guided by the polepiece $P_2$ along the periphery of the working volume for a distance determined for each magnetic flux line by the permeance of the working volume separating the polepieces $P_2$ and $P_1$ and the magnetomotive force between them. The magnetic flux lines then enter into the working volume from the polepiece $P_2$ and pass across to the opposite polepiece $P_1$, which guides the magnetic flux lines to the south pole of the opposite magnet $M_1$.

The magnets $M_1$ and $M_3$ and the polepieces $P_4$ and $P_3$, as illustrated in FIG. 1, are dimensioned and positioned so that the lines of magnetic flux crossing the working volume from the polepiece $P_4$ to the polepiece $P_3$ are substantially parallel to each other except in the immediate vicinity of the magnets $M_1$ and $M_3$. In the vicinity of the magnet $M_1$, some of the lines of magnetic flux running from the north pole to the south pole of the magnet $M_1$ extend outside the working volume. Likewise, in the vicinity of the magnet $M_3$, some of the lines of magnetic flux running from the north pole to the south of the magnet $M_3$ extend outside the working volume. The lines of magnetic flux outside the working volume in the vicinity of the magnets $M_1$ and $M_3$ are symmetrically distributed with respect to each other, but are oriented in opposite directions.

The remainder of the lines of magnetic flux running from the north pole to the south pole of the magnet $M_1$ and from the north pole to the south pole of the magnet $M_3$, as well as some of the lines of magnetic flux running from the north pole of the magnet $M_1$ to the south pole of the magnet $M_3$, and some of the lines of magnetic flux running from the north pole of the magnet $M_3$ to the south pole of the magnet $M_1$, create a localized pattern of nonparallel magnetic flux lines within a central region of the working volume in the vicinity of the magnets $M_1$ and $M_3$. The lines of magnetic flux in the central region of the working volume are generally nonuniformly distributed with respect to each other. However, this central region of the working volume is relatively small compared to the entire working volume defined by the magnets $M_1$, $M_2$, $M_3$ and $M_4$ and the polepieces $P_1$, $P_2$, $P_3$ and $P_4$.

Within the central region of the working volume, the distribution of magnetic flux lines attributable to the magnets $M_1$ and $M_3$ is "mirror symmetrical" with respect to an axis of symmetry (as shown in perspective view in FIG. 2) extending perpendicularly to a rectangular cross-section through the geometrical center O of the working volume. Outside the working volume, the distribution of magnetic flux lines attributable to the magnets $M_1$ and $M_3$ is likewise "mirror symmetrical" with respect to the same axis of symmetry.

In order to minimize the localized nonuniform magnetic flux pattern within the central region of the working volume, the length (i.e., the distance from the north pole to the south pole) of each of the magnets $M_1$ and $M_3$ is made very short (e.g., one-fourth or less) in comparison to the length of the polepieces $P_1$, $P_2$, $P_3$ and $P_4$. Also, the length of the magnets $M_1$ and $M_3$ is made short (e.g., one-half or less) in comparison to the length of the magnets $M_2$ and $M_4$. Consequently, the lines of magnetic flux within the working volume are substantially parallel to each other throughout most of the working volume (i.e., except in the relatively small central region).

The magnets $M_1$ and $M_3$ are oriented in opposite directions with respect to each other. Consequently, at any point Q along the perpendicular axis of symmetry as illustrated in FIG. 2, the net magnetic flux outside the working volume due to the magnets $M_1$ and $M_3$ is zero, because the magnetic flux contributions made by the magnets $M_1$ and $M_3$, respectively, cancel each other. At any point not on the perpendicular axis of symmetry, the net magnetic flux outside the working volume due to the magnets $M_1$ and $M_3$ is not zero. However, the net magnetic flux at any point well away from the working volume decreases as $1/d^4$ for increasing distances d from the geometrical center O of the working volume. The net magnetic flux outside the working volume due to the magnets $M_1$ and $M_3$ becomes negligibly small at relatively short distances from the magnetic assembly.

With reference again to FIG. 1, the lines of magnetic flux leaving the north pole of the magnet $M_2$ run to the south pole of the same magnet $M_2$. Similarly, the lines of magnetic flux leaving the north pole of the magnet $M_4$ run to the south pole of the same magnet $M_4$. Some of the lines of magnetic flux leaving the north pole of each of the magnets $M_2$ and $M_4$ extend outside the working volume. However, since the magnets $M_2$ and $M_4$ are oriented in opposite directions with respect to each other, the contributions made by the magnets $M_2$ and $M_4$, respectively, to the net magnetic flux at any point Q outside the working volume along the perpendicular axis of symmetry cancel each other. At any point well away from the working volume and not on the axis of symmetry, the net magnetic flux due to the magnets $M_2$ and $M_4$ is not zero but decreases as $1/d^4$ for increasing distances d from the center O of the working volume.

Most of the lines of magnetic flux leaving the north pole of the magnet $M_2$ are guided by the polepiece $P_2$ along the periphery of the working volume toward the north pole of the magnet $M_3$ for a distance determined for each magnetic flux line by the permeance of the working volume separating the polepieces $P_1$ and $P_2$ and the magnetomotive force between the polepieces $P_1$ and $P_2$. The magnetic flux lines then enter into the working volume before reaching the north pole of the magnet $M_3$, and pass across from the polepiece $P_2$ to the opposite polepiece $P_1$, which guides the magnetic flux lines to the south pole of the same magnet $M_2$.

Similarly, most of the lines of magnetic flux leaving the north pole of the magnet $M_4$ are guided by the polepiece $P_4$ along the periphery of the working volume toward the north pole of the magnet $M_1$ for a distance determined by the permeance of the working volume between the polepieces $P_3$ and $P_4$ and the magnetomotive force across the polepieces $P_3$ and $P_4$. The magnetic flux lines enter into the working volume before reaching the north pole of the magnetic $M_1$, and pass across to the opposite polepiece $P_3$, which guides the magnetic flux lines to the south pole of the same magnet $M_4$.

In the embodiment shown in FIG. 1, the polepieces $P_1$, $P_2$, $P_3$ and $P_4$ are all of the same length, which is selected relative to the lengths of the magnets $M_1$, $M_2$, $M_3$ and $M_4$ so that the spatial distribution of the lines of magnetic flux running from the north pole to the south pole of the magnet $M_2$ within the working volume is substantially the same as the spatial distribution of the lines of magnetic flux running from the north pole of the magnet $M_3$ to the south pole of the magnet $M_1$ within the working volume, and so that the spatial distribution of the lines of magnetic flux running from the north pole to the south pole of the magnet $M_4$ within the working volume is substantially the same as the spatial distribution of the lines of magnetic flux running from the north pole of the magnet $M_1$ to the south pole of the magnet $M_3$ within the working volume, except in the central region of the working volume in the immediate vicinity of the magnets $M_1$ and $M_3$ where the lines of magnetic flux are not uniformly distributed.

Although the lines of magnetic flux crossing the working volume are substantially parallel to each other (except in the immediate vicinity of the magnets $M_1$ and $M_3$), the direction of the lines of magnetic flux running from the polepiece $P_4$ to the polepiece $P_3$ is opposite to the direction of the lines of magnetic flux running from the polepiece $P_2$ to the polepiece $P_1$. The net effect, as illustrated in FIG. 1, is that the magnetic flux is substantially uniform throughout most of the working volume, but that the lines of magnetic flux are oriented in one direction in one half of the working volume and in the opposite direction in the other half of the working volume. The leakage of magnetic flux from the working volume is effectively self-cancelling at a relatively short distance from the magnetic assembly because of the opposite directions of the magnetic flux lines in the symmetrical halves of the working volume.

The magnetic flux outside the working volume due to contributions from the magnets $M_1$, $M_2$, $M_3$ and $M_4$ is considered as the stray magnetic flux of the assembly. However, at any point on the axis of symmetry of the assembly as shown in FIG. 2, the stray flux due to the magnet $M_1$ is cancelled by the stray flux due to the magnet $M_3$, and the stray flux due to the magnet $M_2$ is cancelled by the stray flux due to the magnet $M_4$. At any point not on the axis of symmetry, the net stray magnetic flux due to contributions from the magnets $M_1$, $M_2$, $M_3$ and $M_4$ decreases as $1/d^4$ for increasing distances from the center O of the working volume. Thus, at relatively short distances away from the magnetic assembly, substantially no leakage of magnetic flux from the working volume can be detected.

In the cross-sectional view of FIG. 3A, the lines of magnetic flux running from the polepiece $P_2$ to the polepiece $P_1$ are seen to be substantially parallel to each other and uniformly distributed within the working volume. If it should become desirable in a particular application to change the direction or the density distribution of the lines of magnetic flux, such a change could be accomplished by changing the arrangement of the polepieces $P_1$ and $P_2$ from the parallel disposition indicated in FIG. 3A to a non-parallel disposition such as that indicated in FIG. 3B. A corresponding change in the arrangement of the polepieces $P_3$ and $P_4$ could be made to provide a symmetrical magnetic flux distribution throughout the working volume. The particular orientation and distribution of the lines of magnetic flux within the working volume defined by the magnets $M_1$, $M_2$, $M_3$ and $M_4$ and the polepieces $P_1$, $P_2$, $P_3$ and $P_4$ are determined by the orientations of the magnets and the polepieces with respect to each other, and are selected according to the particular application for the magnetic assembly.

In FIG. 4, the graphical conventions used in the drawing to indicate the orientations of the magnetic flux lines are shown. Thus, an "x" is used to indicate a magnetic flux line directed into the plane of the paper, a dot within a circle is used to indicate a magnetic flux line directed out of the plane of the paper, and a broken line with an arrow is used to indicate a magnetic flux line lying in the plane of the paper. Also shown in FIG. 4 is the graphical convention for indicating the trajectory of an electrically charged particle, viz., a double-dashed line with an arrow.

Various applications for magnetic assemblies according to the present invention in changing the trajectories of electrically charged particles are illustrated in FIGS. 5–8 in which trajectories shown are for positively charged particles. For negatively charged particles, the orientations of the magnetic flux lines shown in FIGS. 5–8 would have to be reversed.

In FIG. 5, a beam of positively charged particles is shown incident perpendicularly upon the rectangular cross section of a working volume of magnetic flux produced by the magnetic assembly of FIG. 1. The orientations of the lines of magnetic flux within the working volume are such as to focus the incident particles. The location of the focus varies with the energy of the particles, and all particles of a given momentum are brought to the same focus. By placing charged-particle detectors on the axis of symmetry at various distances from the magnetic assembly shown in FIG. 5, it is possible to obtain "population counts" for particles of various momentum values in a beam of charged particles.

In FIG. 6, a beam of positively charged particles is shown incident perpendicularly upon the rectangular cross section of a working volume of magnetic flux produced by a magnetic assembly in which the magnets are arranged so that the resulting orientations of the lines of magnetic flux within the working volume cause the charged particles in the beam to diverge. The angle of divergence of the charged particles from the direction of incidence depends upon the momentum of the incident particles. A magnetic flux distribution as illustrated in FIG. 6 could be used in defocussing applications.

In FIG. 7, positively charged particles emanating in a solid angle from a distant point source are shown incident upon the rectangular cross section of the working volume of magnetic flux produced by the magnetic assembly of FIG. 1. All electrically charged particles entering the working volume are influenced by the magnetic flux within the working volume, and positively charged particles in one particular narrow momentum band are substantially collimated by the magnetic flux. The disposition of the individual magnets and the value of the magnetic flux density B within the magnetic assembly as illustrated in FIG. 7 can be precisely adjusted to collimate charged particles in a particular momentum range of interest.

In FIG. 8, a beam of positively charged particles is shown incident perpendicularly upon the rectangular cross-section of a working volume of magnetic flux produced by the magnetic assembly of FIG. 1. However, unlike the case illustrated in FIG. 5, the momentum values of the charged particles shown in FIG. 8 are so low relative to the magnetic flux density 8 within the working volume that the charged particles are not merely converged, but are reflected by the lines of magnetic flux. A magnetic flux density strong enough to deflect a beam of charged particles, as in FIG. 8, could be used, e.g., in extraterrestrial space applications to protect sensors from impact by electrically charged particles having momentum values below a preselected value.

The shapes of the polepieces of the magnetic assembly of FIG. 1 could be changed in order to vary the lateral area of the volume of magnetic flux. Thus, as shown in FIG. 9, the polepieces of a magnetic assembly according to the present invention can be shaped to provide a magnetic flux density distribution approximating the "ideal focussing field" as described by C. A. McDowell in *Mass Spectrometry*, McGraw-Hill Book Company, Inc. (1963), pp. 107–112.

The distribution of magnetic flux density at the midplane cross section of the magnetic assembly of FIG. 1 is illustrated graphically in FIG. 10. If the rectangular sides of the magnetic assembly of FIG. 10 were to be bowed outward as indicated in FIG. 11, the distribution of magnetic flux density at the mid-plane cross section of the magnetic assembly would change correspondingly as shown in the graphical representation of FIG. 11. On the other hand, if the rectangular sides of the magnetic assembly of FIG. 10 were to be bowed inward as indicated in FIG. 12, the distribution of magnetic flux density at the mid-plane cross section of the magnetic assembly would change correspondingly as shown in the graphical representation of FIG. 12.

Graphical representations of various magnetic flux density distributions obtainable with magnetic assemblies according to the present invention are shown in FIGS. 13-16. In each case, the required flux density distribution for a particular application is achieved by an appropriate shaping of the polepieces. In FIG. 13, opposing polepieces are parallel to each other on opposite sides of the working volume. In FIG. 14, opposing polepieces are inclined with respect to each other; and in FIG. 15, opposing polepieces are of chevron-shaped transverse cross-sectional configuration with chevron apices projecting toward each other. In FIG. 16, opposing polepieces have inwardly protruding poletips along their edges. The particular configuration of the opposing polepieces in each case is tailored to provide the corresponding magnetic flux density distribution.

Two or more magnetic assemblies according to the present invention could be arranged in adjacent planar disposition with respect to each other, as illustrated in FIGS. 17 and 18, to fill an area of any desired size and configuration with discrete regions of uniform magnetic flux density without significant leakage of magnetic flux from any of the assemblies. FIG. 17 illustrates how a plurality of magnetic assemblies can be added together in end-to-end disposition to provide a desired number of regions in which the distribution of magnetic flux density is substantially uniform. FIG. 18 illustrates how a plurality of magnetic assemblies can be added together in side-by-side disposition to provide a desired number of regions of substantially uniform magnetic flux density.

In FIG. 17(A), a region of uniform magnetic flux density is illustrated wherein the configuration of the region is defined by the dispositions of the side magnets $M_1$ and $M_3$ and the end magnets $M_2$ and $M_4$ (which concomitantly determine the dispositions of the polepieces $P_1$, $P_2$, $P_3$ and $P_4$) as described above in connection with FIG. 1. In FIG. 17(B), two magnetic assemblies as shown in FIG. 1 (where one assembly comprises the magnets $M_1$, $M_2$, $M_3$ and $M_4$ and the other assembly comprises the magnets $M_1'$, $M_2'$, $M_3'$ and $M_4'$) are arranged end-to-end with respect to each other. To form the arrangement of magnets shown in FIG. 17(B), the adjacent end magnets $M_4$ and $M_2'$ of the two assemblies are eliminated, and the corresponding side magnets $M_1$ and $M_1'$ on one side and $M_3$ and $M_3'$ on the other side of the two combined assemblies are disposed in tandem with each other.

In FIG. 17(C), three magnetic assemblies as shown in FIG. 1 are arranged end-to-end with respect to each other. In effect, the arrangement of magnets as shown in FIG. 17(C) is formed by adding a further magnetic assembly as shown in FIG. 17(A) comprising the magnets $M_1''$, $M_2''$, $M_3''$ and $M_4''$ to the combined magnetic assemblies as shown in FIG. 17(B). Thus, to form the arrangement shown in FIG. 17(C), the adjacent end magnets $M_4'$ and $M_2''$ are eliminated, and the corresponding side magnets $M_1$, $M_1'$ and $M_1''$ on one side and $M_3$, $M_3'$ and $M_3''$ on the other side of the three combined assemblies are disposed in tandem with each other.

In general, the reluctance of the path of a magnetic flux line from the north pole of one side magnet to the south pole of the opposite side magnet of a magnetic assembly according to the present invention is substantially the same regardless of whether the magnetic circuit formed by the magnets and polepieces of the assembly is completed simply by a single end magnet (e.g., by the end magnet $M_4$ in FIG. 17(A)), or by an additional pair of side magnets and an end magnet (e.g., by side magnets $M_1'$ and $M_3'$ and the end magnet $M_4'$ in FIG. 17(B)), or by yet another pair of side magnets as well as the previous additional side magnets and end magnet (e.g., by side magnets $M_1'$ and $M_1''$, side magnets $M_3'$ and $M_3''$, and end magnet $M_4''$ in FIG. 17(C)).

There is no theoretical limit to the number of magnetic assemblies as shown in FIG. 1 that can be added end-to-end to form replicated magnetic assemblies like those illustrated in FIGS. 17(B) and 17(C). A chain of such magnetic assemblies in end-to-end disposition could be repeated any number of times as appropriate for a particular application.

In FIG. 18, an unspecified number of magnetic assemblies as shown in FIG. 1 are indicated as being arranged in side-by-side disposition with respect to each other to form a replicated magnetic assembly. The replicated magnetic assembly of FIG. 18 provides a desired number of discrete regions of substantially uniform magnetic flux density without significant magnetic flux leakage from any of the regions. In a side-by-side disposition of magnetic assemblies as indicated in FIG. 18, the side magnets of adjacent assemblies are oriented in the same direction so as to become in effect a single magnet. The end magnets of adjacent assemblies are oriented so that like poles face each other. There is no theoretical limit to the number of magnetic assemblies that can be added side-by-side.

The basic magnetic assembly as shown in FIG. 1 can be replicated to form longer and/or wider magnetic assemblies as shown in FIGS. 17 and 18 for use in applications such as the biasing of arrays of separate magnetic bubble memories. Where weight is a significant consideration in a particular application, the basic magnetic assembly of FIG. 1 as well as a replicated magnetic assembly as shown in FIGS. 17 and 18 can provide a high ratio of magnetic flux per unit magnetic assembly weight.

This invention has been described above in terms of particular embodiments and applications. However, other embodiments and applications for the present invention would be apparent to workers skilled in the art upon perusal of the above description and the accompanying drawing. Therefore, the foregoing description is to be considered as merely illustrative of the invention, which is defined by the following claims and their equivalents.

We claim:

1. A magnetic assembly comprising four magnets and four flux-carrying polepieces arranged to define a working volume of magnetic flux, said magnets being in series-opposed disposition with respect to each other, each polepiece providing a flux path into said working volume for magnetic flux from like poles of two of said magnets, magnetic flux being distributed substantially uniformly in a major portion of said working volume.

2. The magnetic assembly of claim 1 wherein said magnets and polepieces are arranged to define a generally rectangular configuration for said working volume.

3. The magnetic assembly of claim 1 wherein said magnets and polepieces are arranged so that a beam of electrically charged particles entering said working volume is converged to a focus.

4. The magnetic assembly of claim 1 wherein said magnets and polepieces are arranged so that electrically charged particles entering said working volume are collimated into a beam.

5. The magnetic assembly of claim 1 wherein said magnets and polepieces are arranged so that a beam of electrically charged particles entering said working volume is diverged.

6. The magnetic assembly of claim 1 wherein said magnets and polepieces are arranged so that electrically charged particles approaching said working volume are reflected.

7. The magnetic assembly of claim 2 comprising at least two additional magnets correspondingly positioned on opposite sides of said rectangular working volume of magnetic flux, whereby said magnetic assembly is in an end-to-end expanded configuration.

8. The magnetic assembly of claim 2 in combination with another magnetic assembly according to claim 2, both of said magnetic assemblies being positioned so that a magnet on one side of the working volume defined by one magnetic assembly is adjacent a magnet on a corresponding side of the working volume defined by the other magnetic assembly, said adjacent magnets having substantially identical orientations, whereby said magnetic assembly of claim 2 is replicated in side-by-side configuration.

* * * * *